United States Patent [19]

Moussie

[11] Patent Number: 4,494,135
[45] Date of Patent: * Jan. 15, 1985

[54] PROGRAMMABLE READ ONLY MEMORY CELL HAVING AN ELECTRICALLY DESTRUCTIBLE PROGRAMMATION ELEMENT INTEGRALLY FORMED WITH A JUNCTION DIODE

[75] Inventor: Michel Moussie, Caen, France

[73] Assignee: U.S. Philips Corporation, New York, N.Y.

[*] Notice: The portion of the term of this patent subsequent to Oct. 21, 1997 has been disclaimed.

[21] Appl. No.: 425,147

[22] Filed: Sep. 28, 1982

Related U.S. Application Data

[63] Continuation of Ser. No. 154,251, May 29, 1982, abandoned, which is a continuation of Ser. No. 946,261, Sep. 27, 1978, abandoned.

[30] Foreign Application Priority Data

Apr. 6, 1976 [FR] France .................... 78 10208
Sep. 30, 1977 [FR] France .................... 77 29477

[51] Int. Cl.³ ............... H01L 29/04; H01L 27/10; H01L 45/00; G11C 17/06
[52] U.S. Cl. ........................... 357/59; 357/4; 357/45; 365/96; 365/105
[58] Field of Search ............... 357/4, 45, 59; 365/96, 365/105, 175

[56] References Cited

U.S. PATENT DOCUMENTS

| 3,384,879 | 5/1968 | Stahi | 357/45 |
| 3,486,087 | 12/1969 | Legat et al. | 357/59 |
| 3,651,385 | 3/1972 | Kobayashi | 357/59 |
| 3,699,403 | 10/1972 | Boleky | 357/4 |
| 3,792,319 | 2/1974 | Tsang | 357/59 |
| 3,909,805 | 9/1975 | Touron et al. | 365/105 |
| 4,041,518 | 8/1977 | Shimizu et al. | 357/59 |
| 4,041,522 | 8/1977 | Oguey et al. | 357/59 |
| 4,229,757 | 10/1980 | Moussie | 357/59 |

Primary Examiner—Gene M. Munson
Attorney, Agent, or Firm—Robert T. Mayer; Steven R. Biren

[57] ABSTRACT

A programmable read-only memory includes a number of programmable memory cells, each of which is formed in a thin layer of semiconductor material which extends on an insulating layer of a semiconductor body. Each programmable memory cell includes a p-n junction diode and an electrically destructible programmation element which are integrally formed in the thin layer of semiconductor material. The programmation element includes a necked-down portion of the thin layer, and this element may also have a p-n junction. The resulting structure yields a memory cell which is simple, highly compact, and which can be easily and reliably manufactured by known methods.

4 Claims, 15 Drawing Figures

PROGRAMMABLE READ ONLY MEMORY CELL HAVING AN ELECTRICALLY DESTRUCTIBLE PROGRAMMATION ELEMENT INTEGRALLY FORMED WITH A JUNCTION DIODE

This is a continuation of application Ser. No. 154,251, filed May 29, 1982, which is a continuation of application Ser. No. 946,261, filed Sept. 27, 1978, which are now abandoned.

The present invention relates to a semiconductor device comprising a programmable read only memory having cells, which each comprise at least one p-n junction diode and an electrically destructible programmation element.

Certain semiconductor devices of the so-called "integrated circuit" type comprise multiple circuits and it is sometimes necessary, during the manufacture of the device, to reserve the establishment of certain circuits and to be able to manufacture them in a selective manner after the completion of the device in its envelope. This is the case, for example, with so-called programmable integrated read only memories in which, in order to write information, circuits selected according to a determined program are established or interrupted definitively by means of electric pulses addressed from the exterior.

Other integrated semiconductor arrangements are known also comprising cells of the same type which arrangements are also programmable, for example certain decoding devices, and certain devices for handling data groups. These devices will also be designated hereinafter by the generic term memories.

A programmation method in which fusible programmable elements are used consists of establishing first of all at the possible connection points a connection comprising a weak point where a selectively supplied current pulse may produce a fusion to positively open the selected circuit. One of the first disadvantages of programmation of devices by fusion has been the necessity of operations to locally deposit fusible resistance metals, for example nickel chromium, on an integrated circuit of semiconductor material which otherwise is homogeneous. It has therefore been endeavored to provide fuses of semiconductor material, notably of polycrystalline silicon. This is the case, for example, with the fusible connections described in particular in French Patent Specification No. 2,168,368 (corresponding to U.S. Pat. No. 3,792,319) which are formed in a polycrystalline silicon layer deposited on a substrate with the interposition of an insulating layer traversed by the connections connecting the fuses to the diodes with which they are in series. The diodes, or the more complicated components which are in series with the fuses, are integrated in the substrate, but, besides these components, a place has often to be reserved for associated circuits such as decoder circuits, addressing circuits, reading circuits, amplifier circuits, etc. which cooperate with the memory cells and which occupy a considerable surface area. The area of the slice necessary to accommodate all these elements is considerable and it appears desirable to reduce it and to be able to further ameliorate the integration density of the devices, in particular for memories which usually comprise a very large number of elements.

Moreover, the programmation method by destruction of a junction is known which consists of the selective shortcircuiting, by an inverse current pulse which is sufficiently strong, of a p-n junction diode called programmation diode provided in any desired connection circuit. However, the methods of localizing planar junctions used so far for the manufacture of programmation diodes, for example, the manufacture of so-called isolation diodes of memory cell matrices, impose minimum dimensions which it is not possible to reduce to such an extent as to obtain a value of the current strength to destroy the junction which is compatible with the low supply voltages imposed by present technology. In this case also it is necessary to reserve beside the memory cells a site for the associated circuits, which necessitates considerable surface area. Of course, in all these cases programmation pulses must not have any action on the circuit elements which are preserved.

SUMMARY OF THE INVENTION

One of the objects of the invention is to ameliorate the integration possibilities of devices programmable by means of electrically destructible elements in a slice having a minimum area.

The invention has for its object to provide a semiconductor device comprising at least combinations of so-called isolation diodes and destructible elements, and presenting a high integration density and a good homogeneity, which elements and diodes can be manufactured by known methods and have a great reliability.

According to the invention, the semiconductor device comprising a programmable read only memory having cells, which each comprise at least one p-n junction diode and an electrically destructible programmation element is characterized in that the pn-junction of said one diode is formed between two regions of a thin layer of semiconductor material extending on an insulating layer which is present on a semiconductor body. Preferably the combination of said pn-junction and said programmation element is provided in said thin semiconductor layer, said layer being of polycrystalline semiconductor material.

Due to the isolating diodes of the device and the programmation elements being formed in a same thin layer, the circuits constituted by said diodes and elements have a homogeneous structure and occupy a limited volume. Since the thin layer extends on a semiconductor body, the latter remains entirely available for associated circuits and for any component other than the diodes and the programmation elements.

In particular, in a preferred embodiment, the diodes and the electrically destructible elements which form part thereof are formed in a thin layer of polycrystalline silicon which itself is formed on an insulating layer covering a body of monocrystalline silicon in which other components may be formed, the insulating layer being traversed, if desired, by connections connecting the said diodes or the said elements to said components.

The manufacture of such a device uses known techniques of deposition, implantation, diffusion, selective etching with localization by masking. The programmation elements are manufactured simultaneously with the diodes without supplementary operations. Moreover, the insulating layer, advantageously of silicon oxide, provides an appreciable thermal isolation between the destructible element and the semiconductor body.

As the case may be, the destruction of the programmation element may open a circuit which was originally closed, or establish a short-circuit in a circuit which was originally open.

In the former case, the zone of one of the two regions of the diode constituting the destructible element is connected directly to a current supply conductor and results in a preferential fusion point where the break of the circuit is produced under the effect of a pulse of sufficient energy.

In the latter case the programmation element comprising a lateral junction is connected to a current supply conductor to apply an overvoltage which can short-circuit by an avalanch phenomenon of sufficient energy. It is to be noted that a junction is said to be lateral when it is limited to a surface substantially normal to the plane of the layer of semiconductor material.

For example, a memory constituted by an XY matrix of memory cells and by associated decoding and addressing circuits is formed from a network of diodes of polycrystalline silicon extending on a silicon oxide layer covering a body of monocrystalline silicon in which the associated circuits are integrated. The entire body is available to form there the components of said associated circuits. The arrangement of diodes and fuses is homogeous, the fuses being an integral part of regions of the diodes. Besides, the polycrystalline silicon, preferably doped, presents characteristics of resistivity and fusion temperature suitable for the realization of fuses.

Preferably the section of the junction of the programmation diode is smaller than one tenth of the section of the junction of the isolating diode, which permits programmation without risk to the latter.

Thus, a memory constituted by an X-Y matrix of memory points cells and associated circuits is formed by a network of isolating diodes and programmation diodes of polycrystalline silicon on the upper face of a layer of silicon oxide covering a monocrystalline silicon body in which circuit elements of the associated circuits are integrated. The entire surface area of the body is available to provide there the circuit elements of the associated circuits. The arrangement of the diodes including the programmation diodes is homogeneous.

BRIEF DESCRIPTION OF THE DRAWING

The invention will now be described in greater detail with reference to the accompanying drawing, in which.

DETAILED DESCRIPTION

Figure 1:
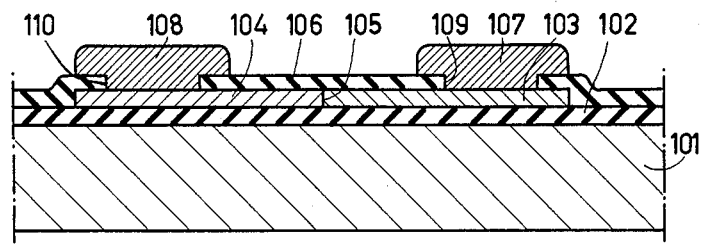
FIG. 1 is a diagrammatic sectional view of a read-only memory cell according to the invention taken on the line I—I of FIG. 2.

It is to be noted that the dimensions in the drawings are not to scale and that notably the dimensions in the direction of thickness are exaggerated so as to make the Figures clearer and that, in the plan views, the insulating layers are considered to be transparent. A programmable read-only memory is manufactured on a semiconductor body 101 (FIGS. 1 and 2) of monocrystalline silicon covered by a layer of silicon dioxide 102. The substrate 101 is, for example, of p-type conductivity and it comprises an epitaxial layer of n-type conductivity in which are formed components of associated circuits, such as decoder circuits, addressing circuits or amplifier circuits necessary to write or read information content of the memory. Said epitaxial layer and the components which are integrated in it and not shown.

A thin layer of polycrystalline silicon has been deposited on the insulating layer 102. The thin layer of polycrystalline silicon comprises several islands which are separated from each other and each of which comprises a region 103 of the n-type conductivity and a region 104 of the p-type conductivity forming between them a lateral junction 105, the assembly of the two regions 103 and 104 presenting a narrower intermediate portion of smaller width situated between and contiguous with two portions of larger width, the junction 105 being situated in said narrower portion. Thus the area of the junction, which junction is substantially normal to the plane of the surface of the semiconductor body, is reduced.

The regions 103 and 104 and their junction 105 are covered by an insulating layer 106 in which windows 109 and 110 are made. Said windows are made on the wider parts of the regions 103 and 104, respectively, and the contacts on the regions 103 and 104 of the diode are made through the windows 109 and 110 by means of aluminum conductors deposited by evaporation in a vacuum, for example, a column conductor 107 and a line conductor 108.

Figure 3:
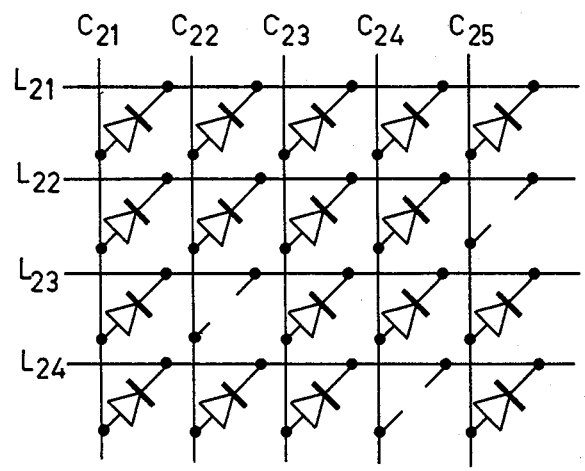
FIG. 3 is a diagram of a matrix of a programmed read-only memory.

The programmable memory is generally manufactured in the form of an XY matrix comprising lines and columns between which the diodes constitute the memory points or cells. Before programmation, each column of the memory is connected to each line by a junction diode, for example, the diodes shown in the diagram of FIG. 3 between the column $C_{23}$ and the lines $L_{21}$, $L_{22}$, $L_{23}$, $L_{24}$. After programmation, certain diodes are deleted and the corresponding connections are interrupted by the fusion of the semiconductor material of its narrow intermediate portion, for example the connections between the column $C_{22}$ and the line $L_{23}$ or between the column $C_{25}$ and the line $L_{22}$ of the diagram of FIG. 3.

Figure 2:
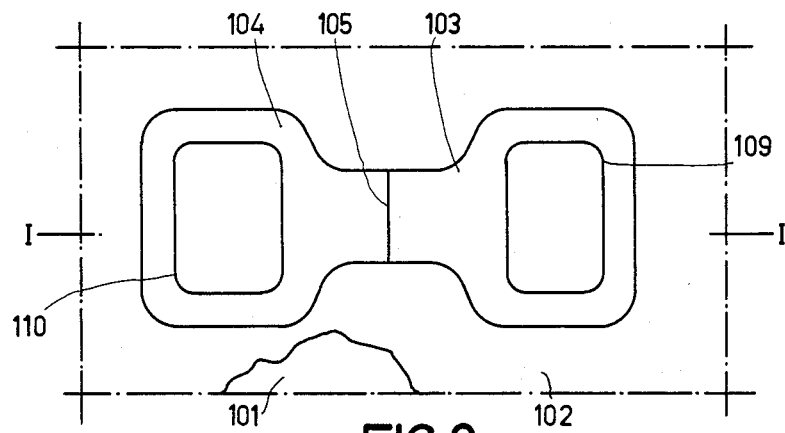
FIG. 2 is a plan view of the cell shown in FIG. 1.

The method of manufacturing a memory of which the cells are in accordance with the example shown diagrammatically in FIGS. 1 and 2 may be carried out by means of operations which are conventionally used in the manufacture of semiconductors.

Starting from a slice of monocrystalline silicon, the associated circuits of the memory with the components and the necessary connections are made in said slice. Said circuits are manufactured according to any known method selected with a view to obtaining the best possible performance and as a function of the desired characteristics, the conditions to be taken into account being on the one hand that the said components and the said connections can be subjected, without damage, to the thermal treatments which are necessitated by the operations of forming the diodes of the memory, and on the other hand that the selected method permits obtaining a surface of the slice having a very good flatness and being suitable to receive a deposition of insulating material and then a deposition of polycrystalline silicon.

The slice in which the necessary circuits have been made is then covered by an insulating layer of silicon dioxide $SiO_2$, preferably deposited chemically from the vapor phase in a thickness of the order of 1000 Å. Said layer may be replaced by a layer of silicon nitride on a sub-layer of $SiO_2$ deposited chemically from the vapor phase. The deposition of polycrystalline silicon is then carried out in which the diodes of the cells of the memory are formed; the deposition is carried out starting from silane $SiH_4$, to which borane $B_2H_6$ has been added in order that the deposited layer be doped with boron, in a reactor at a temperature between 600° and 700° C. The deposited layer is limited to a thickness of 3000 Å and the borane content is adjusted to obtain a boron concentration in the order of $10^{17}$ atoms/cm$^3$.

In the case in which the components and/or the connections already made in the slice cannot withstand high temperatures, the insulating layer may be obtained by any of the known oxidation methods under pressure and at low temperature and the deposition of polycrystalline silicon may be obtained by a method using the plasma gas techniques at temperatures not exceeding 400° C.

The diodes are then localized by etching the silicon layer through an apertured mask of silicon oxide. The polycrystalline silicon is etched by means of a mixture of hydrofluoric acid, nitric acid and acetic acid or by etching by means of a plasma on the basis of fluoride. A fresh mask, preferably, if possible, of silicon nitride, is made to localize the regions of the n conductivity type of the diodes, by implantation of arsenic ions with a zone determining an arsenic concentration of $5.10^{17}$ atoms/cm$^3$.

The device is completed by deposition of an insulating layer of silicon dioxide in which contact windows are made and by deposition of an aluminum layer preceeded by an etching treatment to define the connection conductors.

Figure 4:
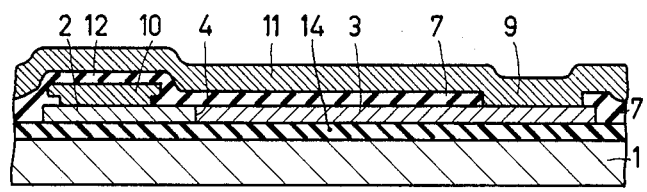
FIG. 4 is a diagrammatic sectional view taken on the line A-B of FIG. 5 of a programmable memory cell having a fuse.
Figure 5:
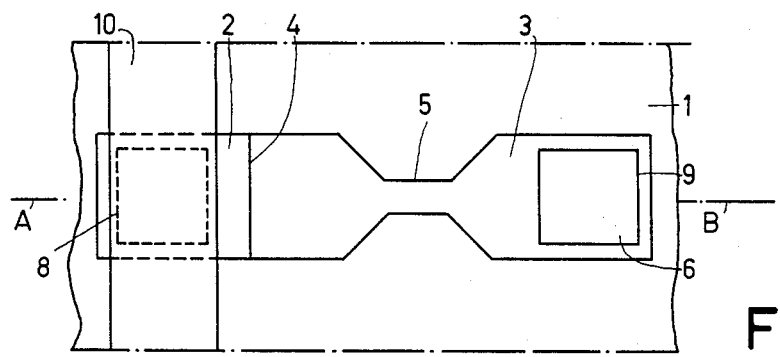
FIG. 5 is the plan view thereof.
Figure 15:
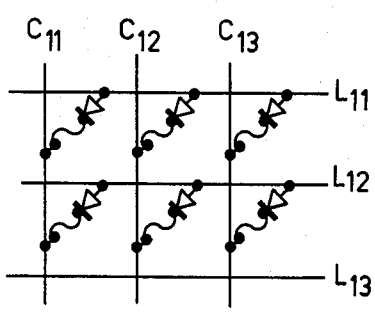
FIG. 15 is diagram of a programmable read only memory having fuses.

The programmable memory cell shown in FIGS. 4 and 5 is manufactured with a body 1 of which at least a surface layer is of insulating material. In a thin layer of semiconductor material a first region 2 of a first conductivity type and a second region 3 of the opposite conductivity type are present, said two regions forming a junction 4. The region 3 has a configuration or outline which presents a narrower portion 5 between the junction 4 and a contact pad 6. The two regions 2 and 3 and the remainder of the surface of the body are covered by an insulating layer 7 having contact apertures 8 for the region 2, and 9 for the region 3. A metal strip 10 is in contact with the region 2 and a metal strip 11 is in contact with the region 3. The strip 11 is oriented perpendicularly to the strip 10, if the programmable memory is of the type having an X-Y matrix, according to the diagram of FIG. 15. Said strip 11 is isolated from the strip 10 by a second portion of the insulating layer 12; said strip is not shown in the plan view of FIG. 5.

The narrow portion 5 of the region 3 of the diode constitutes a weak point and, under a sufficient voltage pulse applied between the conductors 10 and 11 in the forward direction of the junction 4, a current may cause fusion of said narrow portion 5 and the originally unidirectional circuit is opened definitively. The diode and the fuse constitute a combination which is homogeneous and of minimum dimensions. The manufacture of the diode and the fuse, for example of polycrystalline silicon, with isolation by means of silicon oxide, is obtained by techniques known in semiconductor technology.

Figure 6:
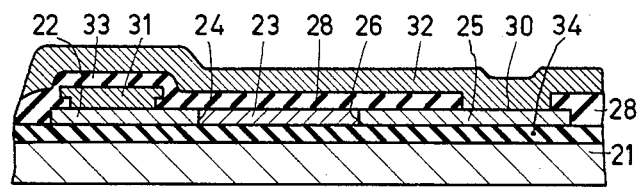
FIG. 6 is diagrammatic sectional view taken on the line C-D of FIG. 7 of a programmable memory cell having a destructible junction.
Figure 7:
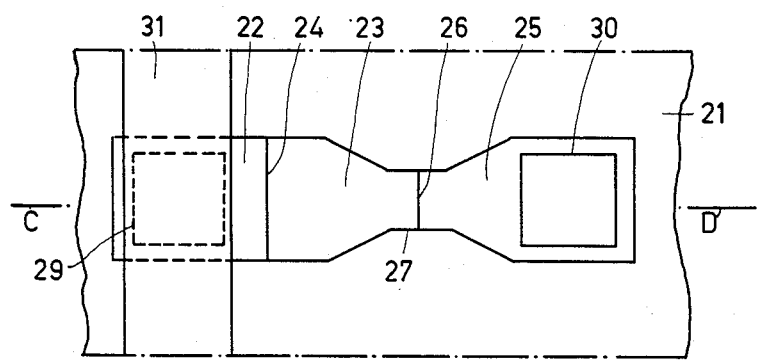
FIG. 7 is the plan view thereof.

The programmable memory cell shown in FIGS. 6 and 7 is manufactured with a body 21 of which at least a surface layer is of insulating material and which comprises, in a thin layer of semiconductor material, a first region 22 of a first conductivity type, a second region 23 of the opposite conductivity type, said two regions forming a junction 24. A third region 25 of the same conductivity type as the region 22 is present and forms with the region 22 a junction 26. The region 23 and the region 25 have a configuration or outline which presents a narrower portion 27 at the area of the junction 26 and the regions 22 and 25 comprise pads for contacting purposes. The three regions and the remainder of the surface of the body are covered by an insulating layer 28 having contact apertures 29 for the region 22 and 30 for the region 25. A metal strip 31 is in contact with the region 22 and a metal strip 32 is in contact with the region 25. The metal strip 32 is not shown in the plan view of FIG. 6; it is oriented perpendicularly to the strip 31 if the memory is of the type having an XY matrix according to the diagram of FIG. 13, and the two strips 31 and 32 are isolated from each other by the insulating layer 33.

The junction 26 has a small cross-section and under a voltage pulse of sufficient strength applied between the conductors 31 and 32 in the forward direction of the junction 24 (blocking direction of the junction 26), a current capable of producing the destruction by short-circuit of said junction 26 without damage to the junction 24 will flow. The circuit which was originally open due to the fact of the two junctions connected in series and in opposition becomes a unidirectional closed circuit. The diode 22, 23 and the diode 23, 25 constitute a combination of elements which is homogeneous and of minimum dimensions. The manufacture of the two diodes, for example of polycrystalline silicon, with isolation by means of silicon oxide, is obtained by techniques known in semiconductor technology.

Figure 8:
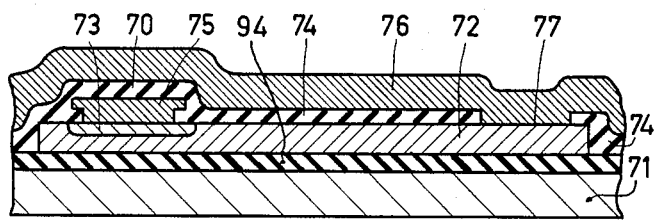
FIG. 8 is a diagrammatic sectional view taken on the line E-F of FIG. 9 of a programmable memory cell having a fuse.
Figure 9:
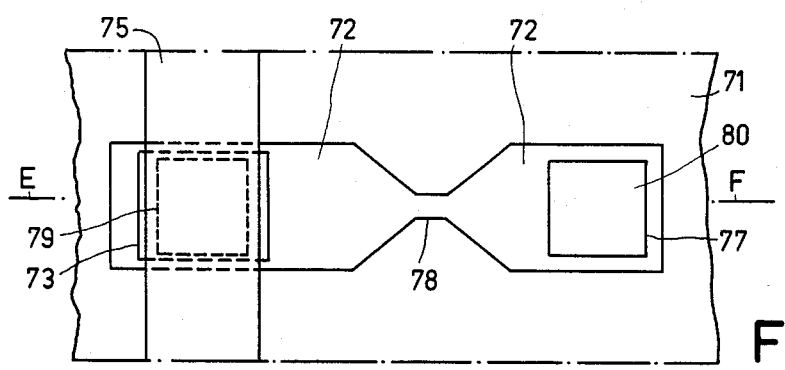
FIG. 9 is the plan view thereof.

The programmable memory cell shown in FIGS. 8 and 9 is manufactured with a body 71 and comprises, in a thin layer of polycrystalline silicon, a first region 72 of a first conductivity type and a second region 73 of the opposite conductivity type, said two regions forming a junction of the planar type. The region 72 presents a narrow portion between the said junction and a contact pad 80. The regions 72 and 73 and the remainder of the slice are covered by an insulating layer 74 having contact windows 79 for the region 73 and 77 for the region 72. A metal conductor 75 is in contact with the region 73 via the window 79 and a conductor 76 (which is not shown in FIG. 8) oriented perpendicularly to the conductor 75 if the memory is of the type having an X-Y matrix, is in contact with the region 72 via the window 77. The two conductors are isolated from each other by an insulating layer 70. This embodiment of the cell differs from the cell described with reference to FIGS. 4 and 5 only as regards the isolating diode which is a planar junction diode instead of being a lateral junction diode. In the two cases a region of the diode presents a narrow portion (78) which constitutes a fusible element. The region 73 is manufactured, for example, by ion implantation.

Figure 10:
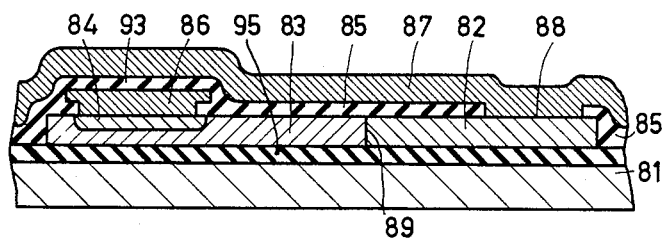
FIG. 10 is a diagrammatic sectional view taken on the line G-H of FIG. 11 of a programmable memory cell having a destructible junction.
Figure 11:
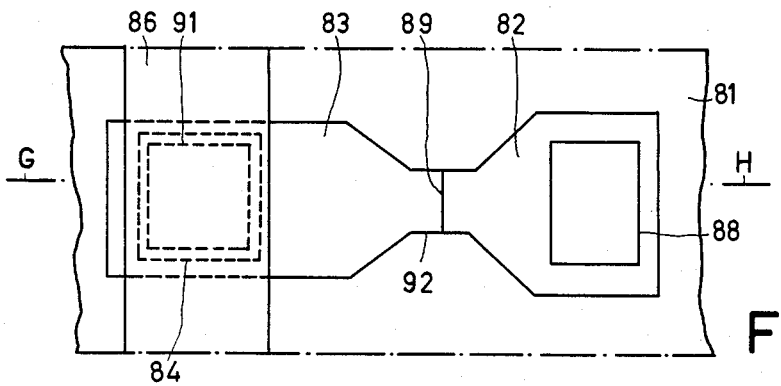
FIG. 11 is the plan view thereof.

The programmable memory cell shown in FIGS. 10 and 11 is manufactured with a substrate 81 and comprises in a thin layer of polycrystalline silicon a first region 84 of the first conductivity type, a second region 83 of the opposite conductivity type, said two regions forming a planar junction. A third region 82 of the same conductivity type as the region 84 forms with the region 83 a lateral junction 89. The regions 82 and 83 have a configuration which presents a narrow portion 92 at the area of the junction 89; the regions and the remainder of the slice are covered by an insulating layer 85 which presents contact windows 88 for the region 82 and 91 for the region 84. A metal conductor 86 is in contact with the region 84 and a metal conductor 87 is in contact with the region 82 (the latter is not shown in FIG. 8) and in the case of an X-Y memory, it is oriented perpendicularly to the conductor 84. The two conductors 87 and 84 are isolated from each other by an insulating layer 93.

The cell in this embodiment differs from the cell described with reference to FIGS. 5 and 6 only as regards the isolating diode which is a planar junction diode instead of being a lateral junction diode. In the two cases, the two regions on either side of the lateral junction form a programmable diode which with a sufficient reverse current is able to be short-circuited. The region 84 is advantageously manufactured by ion implantation.

Figure 12:
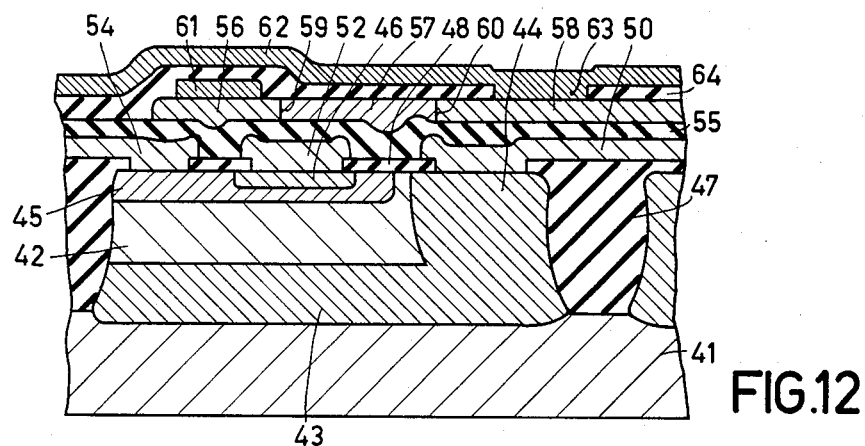
FIG. 12 is a diagrammatic partial sectional view taken on the line K-L of FIG. 13 of a programmable device comprising associated circuits.
Figure 13:
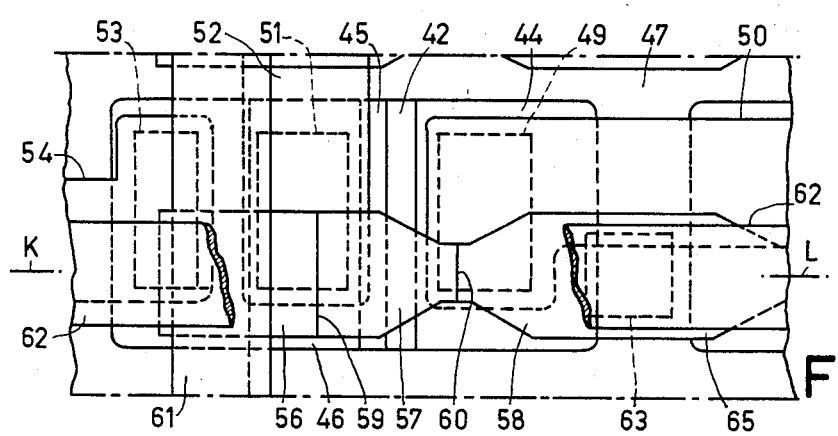
FIG. 13 is the partial plan view thereof.
Figure 14:
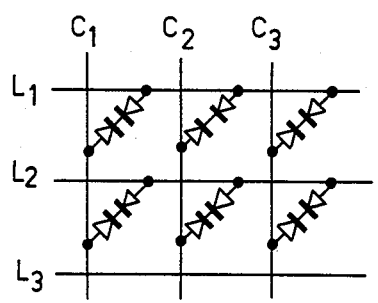
FIG. 14 is a diagram of a programmable read only memory having a destructible junction.

The programmable memory cell shown in FIGS. 12 and 13 is of the type having two diodes connected in series and in opposition. The memory is manufactured starting from a substrate 41 of n-type monocrystalline silicon having an epitaxial layer of the n-type in which are formed the components of associated circuits, which cooperate with the cells of the memory, for example, decoders and amplifiers necessary to write and read the content of the memory. One of the transistors of the associated circuits is of the npn-type and is shown in the sectional view of FIG. 12; it comprises a collector 42, which is a part of the epitaxial layer and has a buried layer 43 of the n+ type. Furthermore a base 45 of the p-type has been diffused in the epitaxial layer and an emitter 46 of the n+ type has been diffused in the base region. The transistor shown is isolated laterally from the other circuit elements by means of areas 47 of silicon oxide reaching the p-type substrate. The surface of the epitaxial layer is covered by a thin insulating layer 48 of silicon oxide which presents apertures for the contacts: an aperture 49 for the contact of the collector provided by a metal conductor 50, an aperture 51 for the contact of the base provided by a metal conductor 52, and an aperture 53 for the contact of the emitter provided by the metal conductor 54. The network of connections of the associated circuits which are integrated in the semiconductor body, which network includes the conductors 50, 52, 54, is covered by an insulating layer 55 of silicon dioxide, which, if desired, may have apertures at the locations where lines or columns of programmable elements must be connected to an associated circuit.

A thin layer of polycrystalline silicon has been grown on the insulating layer 55 of which portions have been preserved corresponding to the diodes of the memory. The diodes are similar to those shown in FIGS. 6 and 7 and comprise a first n-type region 56, a second n-type region 57 and a third p-type region 58. The junction 59 between the regions 57 and 56 has a larger cross-section than the junction 60 between the regions 58 and 57. Of course a similar memory could be made of cells comprising fusible elements in the form of those shown in FIGS. 4 and 5. The junction 60 constitutes the destructible programmation element of the memory cell. The programmation pulses are passed through metal conductors 61 contacting the region 56 and through conductors 62 contacting the region 58. The conductor 61 is an aluminum strip deposited by evaporation in a vacuum, and so is the conductor 62. The latter contacts the region 58 via an aperture 63 made in an insulating layer 74 of silicon oxide which covers the whole of the slice and notably the conductors 61.

Several memory cells similar to the cell constituted by the regions 56, 57 and 58 are provided on a same line, the contact established via the aperture 63 may serve for two adjacent cells, the region 58 being prolonged to constitute the third region 65 of a cell adjacent that described. This arrangement provides a saving in area which may result in an increased integration density.

The method of manufacturing a memory of which the cells correspond with the example shown diagrammatically in FIGS. 5 and 6 comprises operations which are conventional techniques used in the manufacture of semiconductors.

Starting from a slice of monocrystalline silicon, the associated circuits of the memory are made in the slice, including the circuit elements as well as the necessary connections. Said circuits are manufactured according to any of the known techniques chosen with a view to obtaining the best performance and dependent on the desired characteristics. The conditions which are to be taken into account are on the one hand that said circuit elements and said connections must be able to withstand without damage the thermal treatments which are necessitated by the operations of forming the isolating diodes and the programmation diodes of the memory, and on the other hand that the method chosen should permit obtaining a slice surface which is reasonably flat and able to receive a deposition of insulating material and then of polycrystalline silicon of sufficient quality.

The slice in which the necessary circuits have been made is then covered with an insulating layer of silicon dioxide, preferably deposited chemically from the vapor phase, in a thickness in the order of 1000 Å. This layer may be replaced by a layer of silicon nitride on a sublayer of $SiO_2$ deposited chemically from the vapor phase. Then the deposition of polycrystalline silicon is effected in which the diodes of the memory cells are formed subsequently: the deposition is effected from silane $SiH_4$, to which borane $B_2H_6$ has been added so that the deposited layer is doped with boron, in a reactor at a temperature between 600° and 700° C. The deposition is controlled to provide a layer having a thickness of approximately 3000 Å and the content of borane is adjusted to obtain a boron concentration in the order of $10^{17}$ atoms/cm$^3$.

In the case in which the circuit elements and/or the connections already provided in and/or on the slice cannot withstand high temperatures, the insulating layer may be obtained by any of the known methods of oxidation under pressure at low temperature, and the deposition of polycrystalline silicon may be obtained by a method using plasma gas techniques and temperatures not exceeding 400° C.

The diodes are then localized by etching the silicon layers by means of a photoetched silicon oxide mask. The polycrystalline silicon is attached by means of a mixture of hydrofluoric acid, nitric acid and acetic acid or by etching by means of a plasma on the basis of fluoride. A fresh mask, preferably if possible of silicon nitride, is provided to localize the regions of the n-conductivity type of the diodes, by implantation of arsenic ions with a dose determining an arsenic concentration of $5.10^{17}$ atoms/cm$^3$.

The device is completed by deposition of an insulating layer of silicon dioxide in which contact windows are opened and by a deposition of aluminum followed by an etching treatment defining the connection conductors.

A memory manufactured as described may use programmation currents ensuring the short-circuit of the desired junctions in the order of 20 mA if the junctions of the programmation diodes have an area of the order of 1 $\mu m^2$. For example, thickness of silicon layer is about 0.3 $\mu m$ and the width at the narrowest portion where the junction is present is approximately 3 $\mu m$.

What is claimed is:

1. A semiconductor device comprising a programmable read-only memory having a plurality of programmable memory cells, which comprises:

a semiconductor body;

a thermally and electrically insulating layer on said body;

a thin layer of polycrystalline semiconductor material extending on said insulating layer and having regions of opposite type conductivity and a necked-down region;

at least one first p-n junction diode formed between said regions of opposite type conductivity in said thin layer of polycrystalline semiconductor material; and an electrically destructible programmation element integrally formed with each said first p-n junction diode in said thin layer of polycrystalline semiconductor material to form a programmable memory cell, said programmation element comprising a second shortable p-n junction diode formed in said necked-down region of said thin layer and having two semiconductor regions of opposite conductivity type which form the junction, said second diode being connected back-to-back and in series with said first diode, the connected-together regions of said first and second diodes comprising a common region of said thin layer.

2. A semiconductor device as claimed in claim 1, further comprising additional circuit elements operatively connected to said memory cells and integrated in said semiconductor body.

3. A semiconductor device as claimed in claim 2, wherein said semiconductor body is a monocrystalline body and said additional circuit elements are located at least partly below that portion of said thin layer in which the memory cells are formed.

4. A semiconductor device as claimed in claim 1, wherein said semiconductor body comprises monocrystalline silicon, said insulating layer comprises silicon oxide, and said thin layer on said insulating layer comprises polycrystalline silicon.

* * * * *